US009923067B2

(12) United States Patent
Jiang et al.

(10) Patent No.: US 9,923,067 B2
(45) Date of Patent: Mar. 20, 2018

(54) THIN-FILM TRANSISTOR AND METHOD FOR FABRICATING THE SAME, ARRAY SUBSTRATE AND METHOD FOR FABRICATING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Wenbo Jiang, Beijing (CN); Shiyi Xie, Beijing (CN); Zhiying Bao, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/097,740

(22) Filed: Apr. 13, 2016

(65) Prior Publication Data
US 2016/0315158 A1 Oct. 27, 2016

(30) Foreign Application Priority Data

Apr. 24, 2015 (CN) .......................... 2015 1 0203148

(51) Int. Cl.
*H01L 29/04* (2006.01)
*H01L 29/10* (2006.01)
(Continued)

(52) U.S. Cl.
CPC .... *H01L 29/41733* (2013.01); *H01L 29/0657* (2013.01); *H01L 29/401* (2013.01);
(Continued)

(58) Field of Classification Search
USPC .............. 257/E21.535, E29.113, 59, 60, 72; 349/43; 438/29
See application file for complete search history.

(56) References Cited

U.S. PATENT DOCUMENTS 7,507,648 B2 * 3/2009 Kakkad ............ H01L 21/02532
257/E21.134
8,203,662 B2 * 6/2012 Kang ...................... H01L 27/12
257/60
(Continued)

FOREIGN PATENT DOCUMENTS

CN 104160482 A 11/2014
EP 1892766 A1 2/2008
(Continued)

OTHER PUBLICATIONS

CN Office Action, Application No. 201510203148.X, dated May 3, 2017, 11 pps.: with English Translation.

*Primary Examiner* — Telly Green
(74) *Attorney, Agent, or Firm* — Armstrong Teasdale LLP

(57) ABSTRACT

A thin-film transistor (TFT) includes a gate electrode, a gate insulation layer, a source electrode, a drain electrode and an active layer arranged on a base substrate. The active layer includes an un-doped a-Si layer, a first doped a-Si layer and a second doped a-Si layer. One of the source electrode and the drain electrode is in contact with the first doped a-Si layer, and the other of the source electrode and the drain electrode is in contact with the second doped a-Si layer. The source electrode and the drain electrode are on different horizontal planes and spaced apart from each other, and the un-doped a-Si layer is positioned between the source electrode and the drain electrode.

18 Claims, 6 Drawing Sheets

(51) Int. Cl.

| | |
|---|---|
| *H01L 31/00* | (2006.01) |
| *H01L 29/417* | (2006.01) |
| *H01L 29/786* | (2006.01) |
| *H01L 29/66* | (2006.01) |
| *H01L 29/06* | (2006.01) |
| *H01L 29/40* | (2006.01) |

(52) U.S. Cl.
CPC .. *H01L 29/41775* (2013.01); *H01L 29/66765* (2013.01); *H01L 29/78648* (2013.01); *H01L 29/78669* (2013.01); *H01L 29/78696* (2013.01)

(56) References Cited

U.S. PATENT DOCUMENTS

| | | | |
|---|---|---|---|
| 9,627,421 B2 * | 4/2017 | Sun | H01L 29/7869 |
| 2005/0092994 A1 | 5/2005 | Ishige | |
| 2007/0004185 A1 * | 1/2007 | Kakkad | H01L 21/02532 |
| | | | 438/486 |
| 2007/0187688 A1 * | 8/2007 | Whight | H01L 29/78618 |
| | | | 257/72 |
| 2008/0217688 A1 * | 9/2008 | Matsukura | H01L 29/41733 |
| | | | 257/347 |
| 2010/0133539 A1 * | 6/2010 | Kang | H01L 27/12 |
| | | | 257/59 |
| 2016/0260754 A1 * | 9/2016 | Sun | H01L 21/77 |

FOREIGN PATENT DOCUMENTS

| | | | |
|---|---|---|---|
| JP | 60206174 A | 10/1985 | |
| WO | 2011151955 A1 | 12/2011 | |
| WO | WO 2015180357 A1 * | 12/2015 | H01L 21/77 |

\* cited by examiner

THIN-FILM TRANSISTOR AND METHOD FOR FABRICATING THE SAME, ARRAY SUBSTRATE AND METHOD FOR FABRICATING THE SAME, AND DISPLAY DEVICE

CROSS REFERENCE TO RELATED APPLICATIONS

This application claims priority to Chinese Patent Application No. 201510203148.X, which was filed on Apr. 24, 2015, the disclosure of which is incorporated herein by reference in its entirety.

BACKGROUND

The present disclosure relates to the field of display technology, and in particular to a thin-film transistor (TFT) and a method for fabricating the same, an array substrate and a method for fabricating the same, and a display device.

Thin-film transistors (TFTs) have been arranged on substrates of electronics products, such as a flat display, a thin-film solar cell and so forth. The TFTs are key elements for any liquid crystal display devices, which play a vital role for performance of these display devices.

As display technology improves, display panels that have a super narrow bezel, or even no bezel, and a super high aperture ratio will prevail in the market, which needs a smaller size of the TFTs. As shown in FIG. 1, according to a conventional technology, a-Si TFT may include a gate electrode 11, a gate insulation layer 12, an active layer 13, a source electrode 14 and a drain electrode 15 arranged sequentially on a base substrate 10. Here, the active layer 13 may include an un-doped a-Si layer 131 and doped a-Si layers 132, 133. The source electrode 14 is in contact with the doped a-Si layer 132, while the drain electrode 15 is in contact with the doped a-Si layer 133, so as to reduce resistance. A method for fabricating the TFT as shown in FIG. 1 usually adopts patterning processes, which may include exposure process and the like. Provided that a size of the TFT needs to be reduced, a ratio between width and length (W/L) of the TFT has to be increased. However, since a length of the TFT can hardly be further reduced due to exposure process according to the conventional technology, it is almost impossible to further reduce the size of the TFT.

BRIEF DESCRIPTION

Embodiments of the present disclosure provide a thin-film transistor (TFT) and a method for fabricating the same, an array substrate and a method for fabricating the same, and a display device, which can reduce the size of the TFT.

In a first aspect, a thin-film transistor (TFT) is provided. The TFT includes a gate electrode, a gate insulation layer, a source electrode, a drain electrode and an active layer arranged on a base substrate. The active layer includes an un-doped a-Si layer, a first doped a-Si layer and a second doped a-Si layer. One of the source electrode and the drain electrode is in contact with the first doped a-Si layer, and the other of the source electrode and the drain electrode is in contact with the second doped a-Si layer. The source electrode and the drain electrode are on different horizontal planes and spaced apart from each other, and the un-doped a-Si layer is positioned between the source electrode and the drain electrode.

Due to the fact that the source electrode and the drain electrode of the TFT according to embodiments of the present disclosure are spaced apart from each other with the un-doped a-Si layer in between these two electrodes, a length value L in the W/L ratio of the TFT depends on a thickness of the un-doped a-Si layer instead. In comparison with the conventional technology, in which the length value L depends on the exposure process, the length of the TFT according to embodiments of the present disclosure can be further reduced, because the thickness of the un-doped a-Si layer is independent of the exposure process, thereby reducing an entire size of the TFT accordingly.

In an embodiment, a cross section of the un-doped a-Si layer is of a step-like shape, which includes a vertical part, a first horizontal part and a second horizontal part. One of the first doped a-Si layer and the second doped a-Si layer is positioned below the first horizontal part, and the other of the first doped a-Si layer and the second doped a-Si layer is positioned above the second horizontal part. The source electrode and the drain electrode are spaced apart from each other, and the vertical part is positioned between the source electrode and the drain electrode.

In an embodiment, the gate electrode includes a first gate electrode. The gate insulation layer includes a first gate insulation layer. The first gate electrode is arranged on the base substrate. The first gate insulation layer is arranged on the first gate electrode. The drain electrode is arranged on the first gate insulation layer. The first doped a-Si layer is arranged on the drain electrode. The first horizontal part of the un-doped a-Si layer is arranged on the first doped a-Si layer. The second horizontal part of the un-doped a-Si layer is arranged on the first gate insulation layer. The second doped a-Si layer is arranged on the second horizontal part. And the source electrode is arranged on the second doped a-Si layer.

In an embodiment, the TFT further includes a second gate insulation layer and a second gate electrode sequentially arranged on the source electrode. The first and second gate electrodes are connected electrically through a via-hole within the first and second gate insulation layers.

In an embodiment, the TFT may further include a passivation layer arranged on the second gate electrode.

In an embodiment, the TFT further includes a first electrode connected to the drain electrode and a second electrode arranged on the second gate insulation layer and the passivation layer.

In an embodiment, the gate electrode includes a first gate electrode. The gate insulation layer includes a first gate insulation layer. The first gate electrode is arranged on the base substrate. The first gate insulation layer is arranged on the first gate electrode. The first horizontal part of the un-doped a-Si layer is arranged on the first gate insulation layer. The first doped a-Si layer is arranged on the first horizontal part. The drain electrode is arranged on the first doped a-Si layer. The source electrode is arranged on the first gate insulation layer. The second doped a-Si layer is arranged on the source layer. And the second horizontal part of the un-doped a-Si layer is arranged on the second doped a-Si layer.

In an embodiment, the TFT further includes a second gate insulation layer and a second gate electrode arranged on the drain electrode sequentially. The first and second gate electrodes are connected electrically through a via-hole within the first and second gate insulation layers.

In an embodiment, the TFT further includes a passivation layer arranged on the second gate electrode.

In an embodiment, the TFT further includes a first electrode connected with the drain electrode and a second electrode arranged on the second gate insulation layer and the passivation layer.

In another aspect, an array substrate is provided that includes the TFT as described above.

In another aspect, a display device is provided, that includes the array substrate that includes the TFT as described above.

In another aspect of the present disclosure, a method for fabricating a thin-film transistor (TFT) includes forming a gate electrode, a gate insulation layer, a source electrode, a drain electrode and an active layer on a base substrate. The active layer includes an un-doped a-Si layer, a first doped a-Si layer and a second doped a-Si layer. One of the source electrode and the drain electrode is in contact with the first doped a-Si layer, and the other of the source electrode and the drain electrode is in contact with the second doped a-Si layer. The source electrode and the drain electrode are on different horizontal planes and spaced apart from each other and the un-doped a-Si layer is positioned between the source electrode and the drain electrode.

In an embodiment, a cross section of the un-doped a-Si layer includes a step-like shape. The step-like shape includes a vertical part, a first horizontal part and a second horizontal part. One of the first doped a-Si layer and the second doped a-Si layer is positioned below the first horizontal part, and the other of the first doped a-Si layer and the second doped a-Si layer is positioned above the second horizontal part. The source electrode and the drain electrode are spaced apart from each other. The vertical part is positioned between the source electrode and the drain electrode.

In an embodiment, the method further includes forming the first gate electrode and the first gate insulation layer on the base substrate sequentially; forming one of the source electrode and the drain electrode on the first gate insulation layer; forming one of the first and second doped a-Si layers in contact with the one of the source electrode and the drain electrode on the one of the source electrode and the drain electrode; forming the un-doped a-Si layer on the first gate insulation layer and the one of the first and second doped a-Si layers; forming the other of the first and second doped a-Si layers on the first gate insulation layer; and forming the other of the source electrode and the drain electrode on the other of the first and second doped a-Si layers. The other of the source electrode and the drain electrode is in contact with the other of the first and second doped a-Si layers.

In an embodiment, subsequent to the step of forming the other of the source electrode and the drain electrode, the method further includes forming a second gate insulation layer on the base substrate on which the other of the source electrode and the drain electrode is arranged, and forming a second gate electrode on the base substrate on which the second gate insulation layer is arranged. The first and second gate electrodes are connected electrically through a via-hole within the first and second gate insulation layers.

In an embodiment, the method further includes forming a passivation layer on the second gate electrode.

In an embodiment, the method further includes forming a first electrode on the second gate insulation layer and the passivation layer, and forming a second electrode which is connected to the drain electrode.

In another aspect of the present disclosure, a method for fabricating an array substrate is provided, which includes the above method for fabricating the TFT.

In another aspect of the present disclosure, a method for forming a display device is provided, which includes the above method for fabricating the array substrate.

Further aspects and areas of applicability will become apparent from the description provided herein. It should be understood that various aspects of this disclosure may be implemented individually or combination with one or more other aspects. It should also be understood that the description and specific examples herein are intended for purposed of illustration only and are not intended to limit the scope of the present disclosure.

BRIEF DESCRIPTION OF THE DRAWINGS

In order to illustrate the embodiments described herein more clearly, the drawings associated with the embodiments of the present disclosure will be described briefly hereinafter. Obviously, the following drawings merely relate to example embodiments of the present disclosure, and based on these drawings, additional embodiments may become apparent to a person skilled in the art.

DETAILED DESCRIPTION

Embodiments of the present disclosure provide a thin-film transistor (TFT) and a method for fabricating the same, an array substrate and a method for fabricating the same, and a display device. Certain embodiments enable a reduction in a size of the TFT.

In order to make the present disclosure more clear, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "a/an" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Neither thin-film thicknesses of respective layers nor respective area sizes shown in the Figures are drawn according to their true proportions. Rather, the proportions used in the figures are only for illustrative purposes.

A thin-film transistor (TFT) according a specific embodiment of the present disclosure will be described in detail in connection with the Figures. It should be appreciated that a material of an active layer is not limited to silicon, but additionally or alternatively includes any other suitable materials.

Figure 1:
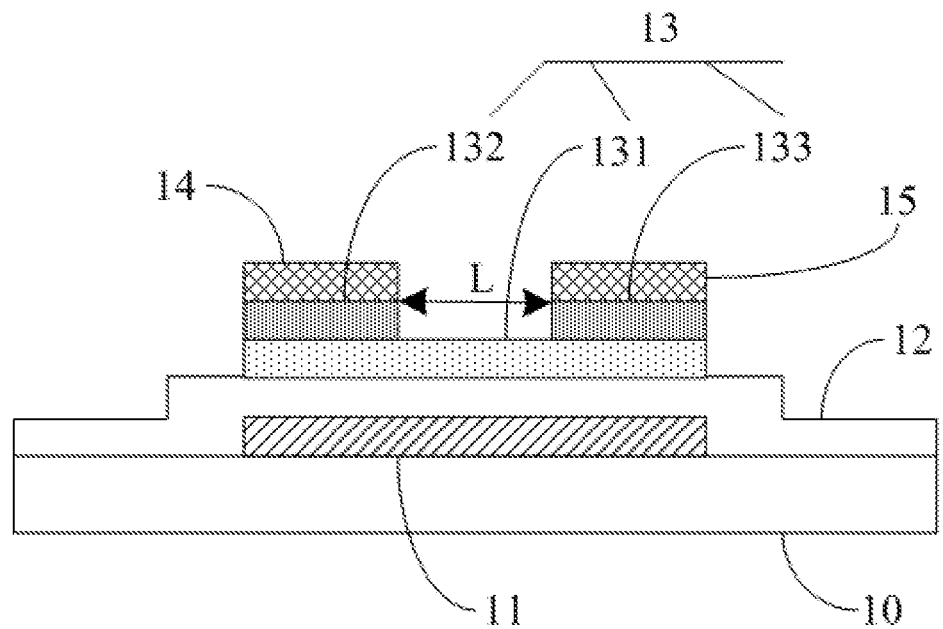
FIG. 1 is a cross sectional diagram illustrating a prior art thin-film transistor (TFT)
Figure 2A:
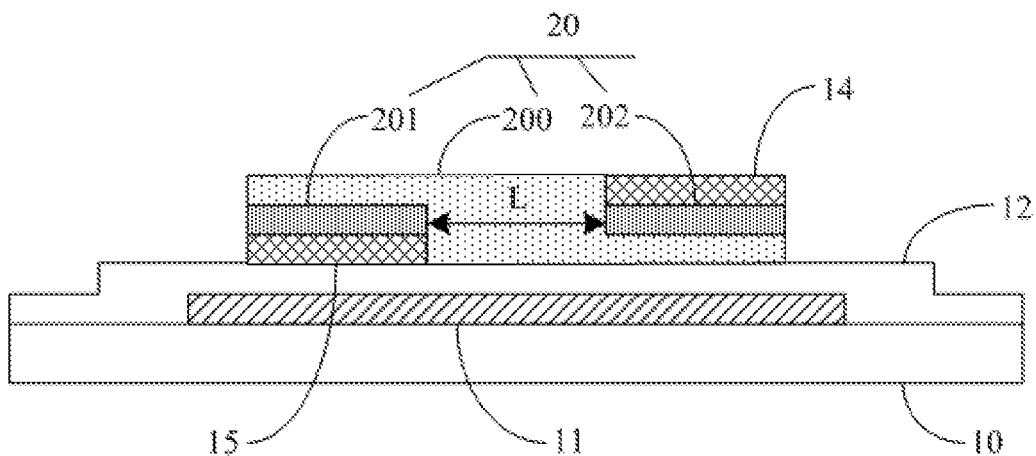
FIGS. 2A and 2B are cross sectional diagrams illustrating a TFT according to an embodiment of the present disclosure.
Figure 2B:
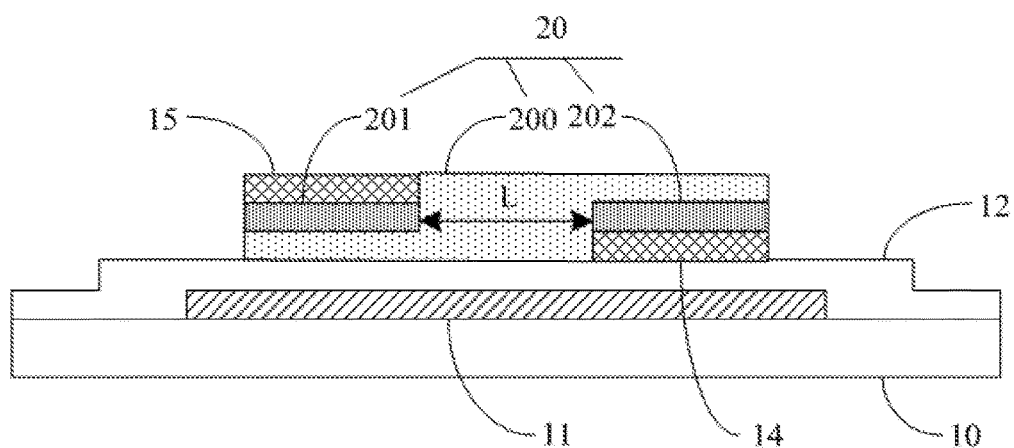

As shown in FIGS. 2A and 2B, the TFT according to the specific embodiment of the present disclosure is provided, which includes a gate electrode 11, a gate insulation layer 12, a source electrode 14, a drain electrode 15 and an active layer 20 arranged on a base substrate 10. Here, the active layer 20 includes an un-doped a-Si layer 200, a first doped a-Si layer 201 and a second doped a-Si layer 202. Further, one of the source electrode 14 and the drain electrode 15 is in contact with the first doped a-Si layer 201, while the other of the source electrode 14 and the drain electrode 15 is in contact with the second doped a-Si layer 202. The source electrode 14 and the drain electrode 15 are on different horizontal planes and spaced apart from each other with the un-doped a-Si layer 200 in between.

In a specific embodiment of the present disclosure, a cross section of the un-doped a-Si layer 200 is of a step-like shape, which includes a vertical part, a first horizontal part and a second horizontal part. The first doped a-Si layer 201 is positioned below the first horizontal part, while the second doped a-Si layer 202 is positioned above the second horizontal part, as shown in FIG. 2A. Alternatively, the first doped a-Si layer 201 is positioned above the first horizontal part, while the second doped a-Si layer 202 is positioned below the second horizontal part, as shown in FIG. 2B. In each case, the source electrode and the drain electrode are spaced apart from each other with the vertical part in between. Specifically, in this specific embodiment of the present disclosure, the horizontal part on the left side of the vertical part is referred to as the first horizontal part, while the horizontal part on the right side of the vertical part is referred to as the second horizontal part.

The TFTs in embodiments of the present disclosure may be either bottom gate TFTs or top gate TFTs, or even side gate TFTs. Therefore embodiments of the present disclosure impose no limitations on specific types of the TFTs. Hereinafter, the bottom gate TFT has been adopted as an example in the specific embodiments of the present disclosure.

Figure 3A:
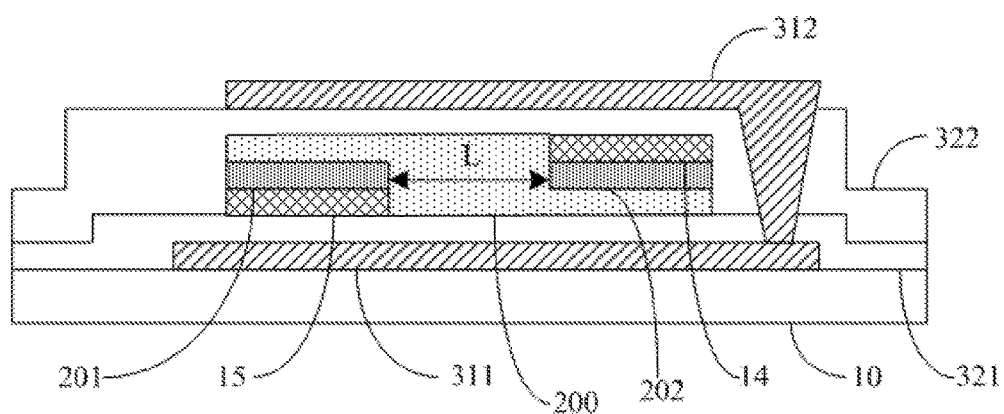
FIGS. 3A and 3B are cross sectional diagrams illustrating a TFT according to another embodiment of the present disclosure.
Figure 4A:
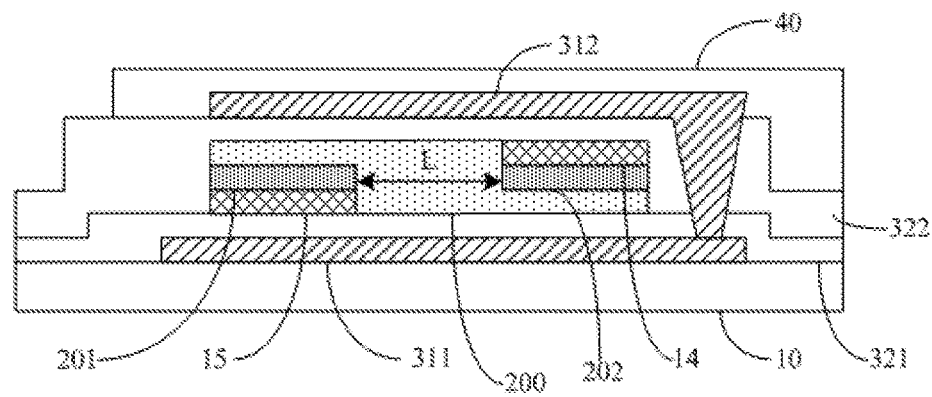
FIGS. 4A and 4B are cross sectional diagrams illustrating a TFT according to still another embodiment of the present disclosure.

As shown in FIG. 3A, in a specific embodiment of the present disclosure, the gate electrode 11 is a first gate electrode 311, whilst the gate insulation layer 12 is a first gate insulation layer 321. Accordingly, in this specific embodiment of the present disclosure, the TFT includes the first gate electrode 311, the first gate insulation layer 321, the drain electrode 15, the first doped a-Si layer 201, the un-doped a-Si layer 200, the second doped a-Si layer 202 and the source electrode 14 arranged sequentially on the base substrate 10. Also in this specific embodiment of the present disclosure, the positions of the source electrode 14 and the drain electrode 15 are exchangeable. Furthermore, in order to better drive the TFT according to this specific embodiment of the present disclosure, the TFT may further include a second gate insulation layer 322 and a second gate electrode 312 arranged on the source electrode 14 sequentially. Specifically, the first gate electrode 311 and the second gate electrode 312 are connected electrically through a via-hole within the first gate insulation layer 321 and the second gate insulation layer 322. In one embodiment of the present disclosure, in order to prevent liquid crystal from subjection to an adverse effect caused by the gate electrode at the top, the TFT according to this specific embodiment of the present disclosure further includes a passivation layer 40 arranged on the second gate electrode 312, as shown in FIG. 4A.

Figure 3B:
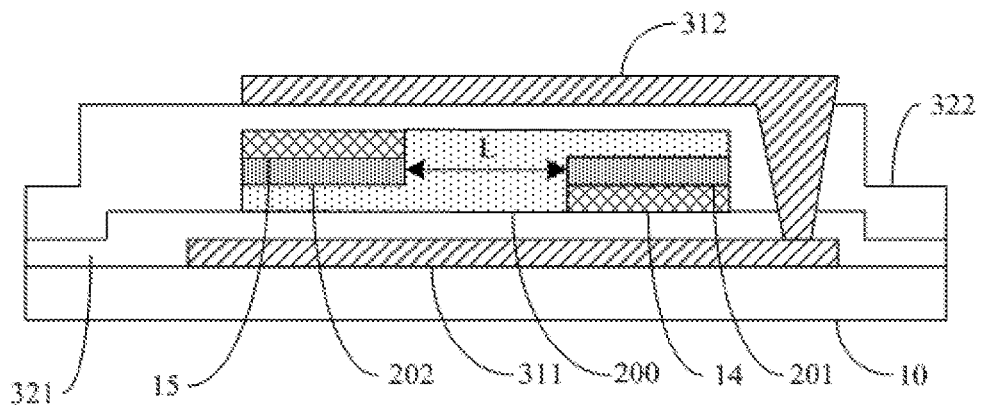
Figure 4B:
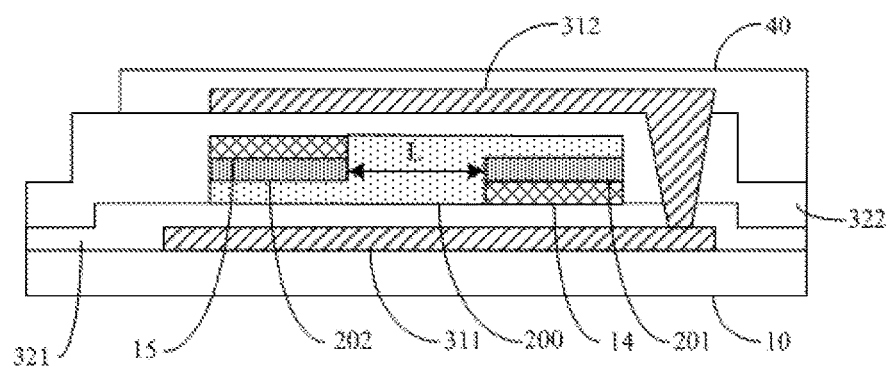

As shown in FIG. 3B, in another specific embodiment of the present disclosure, the gate electrode 11 is the first gate electrode 311, whilst the gate insulation layer 12 is the first gate insulation layer 321. Accordingly, in this specific embodiment of the present disclosure, the TFT includes the first gate electrode 311, the first gate insulation layer 321, the source electrode 14, the first doped a-Si layer 201, the un-doped a-Si layer 200, the second doped a-Si layer 202 and the drain electrode 15 arranged sequentially on the base substrate 10. Also in this specific embodiment of the present disclosure, the positions of the source electrode 14 and the drain electrode 15 are exchangeable. Furthermore, in order to better drive the TFT according to this specific embodiment of the present disclosure, the TFT may further include the second gate insulation layer 322 and the second gate electrode 312 arranged on the drain electrode 15 sequentially. Specifically, the first gate electrode 311 and the second gate electrode 312 are connected electrically through a via-hole within the first gate insulation layer 321 and the second gate insulation layer 322. In one embodiment of the present disclosure, in order to prevent liquid crystal from subjection to an adverse effect caused by the gate electrode at the top, the TFT according to this specific embodiment of the present disclosure further includes a passivation layer 40 arranged on the second gate electrode 312, as shown in FIG. 4B.

Figure 5A:
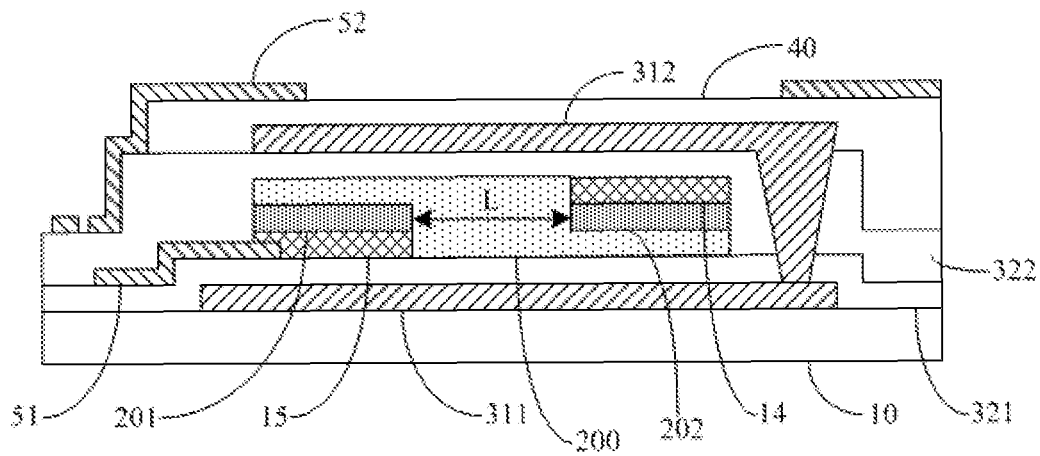
FIGS. 5A and 5B are cross sectional diagrams illustrating an array substrate according to an embodiment of the present disclosure.
Figure 5B:
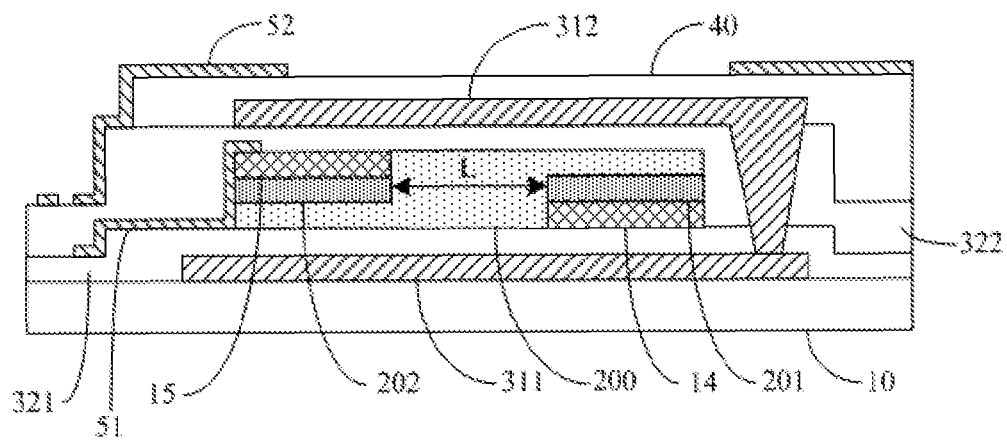

Still another embodiment of the present disclosure also provides an array substrate, which includes the TFT according to the above specific embodiments of the present disclosure. As shown in FIGS. 5A and 5B, the array substrate according to this embodiment of the present disclosure further includes a first electrode layer 51 and a second electrode layer 52. For example, but not by way of limitation, both the first electrode layer 51 and the second electrode layer 52 may be made of Indium Tin Oxides (ITO). For example, but not by way of limitation, the first electrode layer 51 is arranged as pixel electrodes, while the second electrode layer 52 is arranged as common electrodes. The first electrode 51 is connected with the drain electrode 15 according to this specific embodiment of the present disclosure. Of course, in real fabricating processes of alternative embodiments, the first electrode layer 51 is arranged as common electrodes, while the second electrode layer 52 is arranged as pixel electrodes. Furthermore, the second electrode layer 52 in this specific embodiment of the present disclosure is capable of playing an effective role in shielding an electric field, thereby preventing liquid crystal from subjection to an adverse effect caused by the second electrode 312. In order to further prevent liquid crystal from subjection to an adverse effect caused by the second electrode 312, the second electrode 312 is cut open at its top in some embodiments, thereby reducing such load formed between the second electrode 312 and the second electrode layer 52. Since the TFTs according to embodiments of the present disclosure may be arranged within a Gate On Array (GOA) region, the GOA size can be reduced, which facilitates super narrow bezel design.

Figure 7:
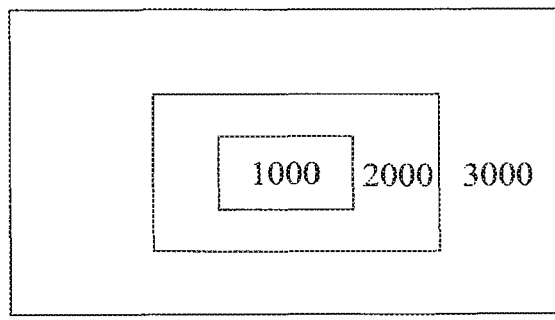
FIG. 7 is a block diagram showing an example embodiment of a display device.

FIG. 7 is an example embodiment of a display device 3000 that includes an array substrate 2000, and the array substrate 2000 includes a TFT 1000. In this example embodiment, TFT 1000 is a TFT as shown in FIGS. 2A, 2B, 3A, 3B, 4A and 4B; and array substrate 2000 is an array substrate as shown in FIGS. 5A and 5B.

Below a method for fabricating the TFT according to embodiments of the present disclosure will be discussed in detail in connection with the FIGS. 1-6.

Figure 6A:
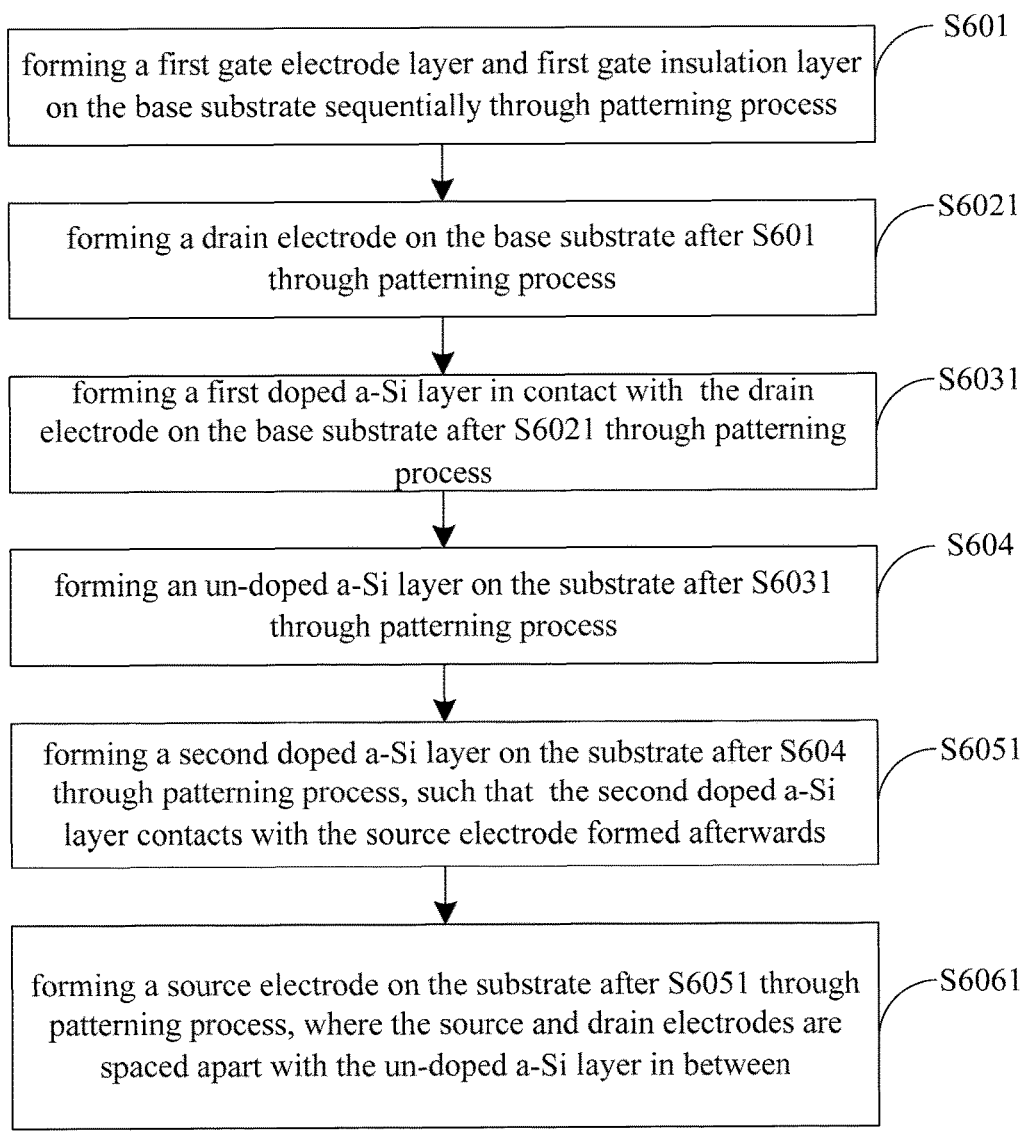
FIGS. 6A and 6B are flow charts illustrating a method for fabricating a TFT according to an embodiment of the present disclosure.

As shown in FIG. 6A, the method for fabricating the TFT according to embodiments of the present disclosure includes the following steps.

In step S601, a first gate layer and a first gate insulation layer are formed on a base substrate sequentially through a patterning process.

In step S6021, a drain electrode is formed on the base substrate after step S601 through a patterning process.

In step S6031, a first doped a-Si layer connected with the drain electrode is formed on the base substrate after step S6021 through a patterning process.

In step S604, an un-doped a-Si layer is formed on the base substrate after step S6031 through a patterning process.

In step S6051, a second doped a-Si layer is formed on the base substrate after step S604 through a patterning process, so as to achieve a contact between the second doped a-Si layer and a source electrode formed afterwards.

In step S6061, the source electrode is formed on the base substrate after step S6051 through a patterning process, where the source electrode and the drain electrode are spaced apart with the un-doped a-Si layer in between.

Figure 6B:
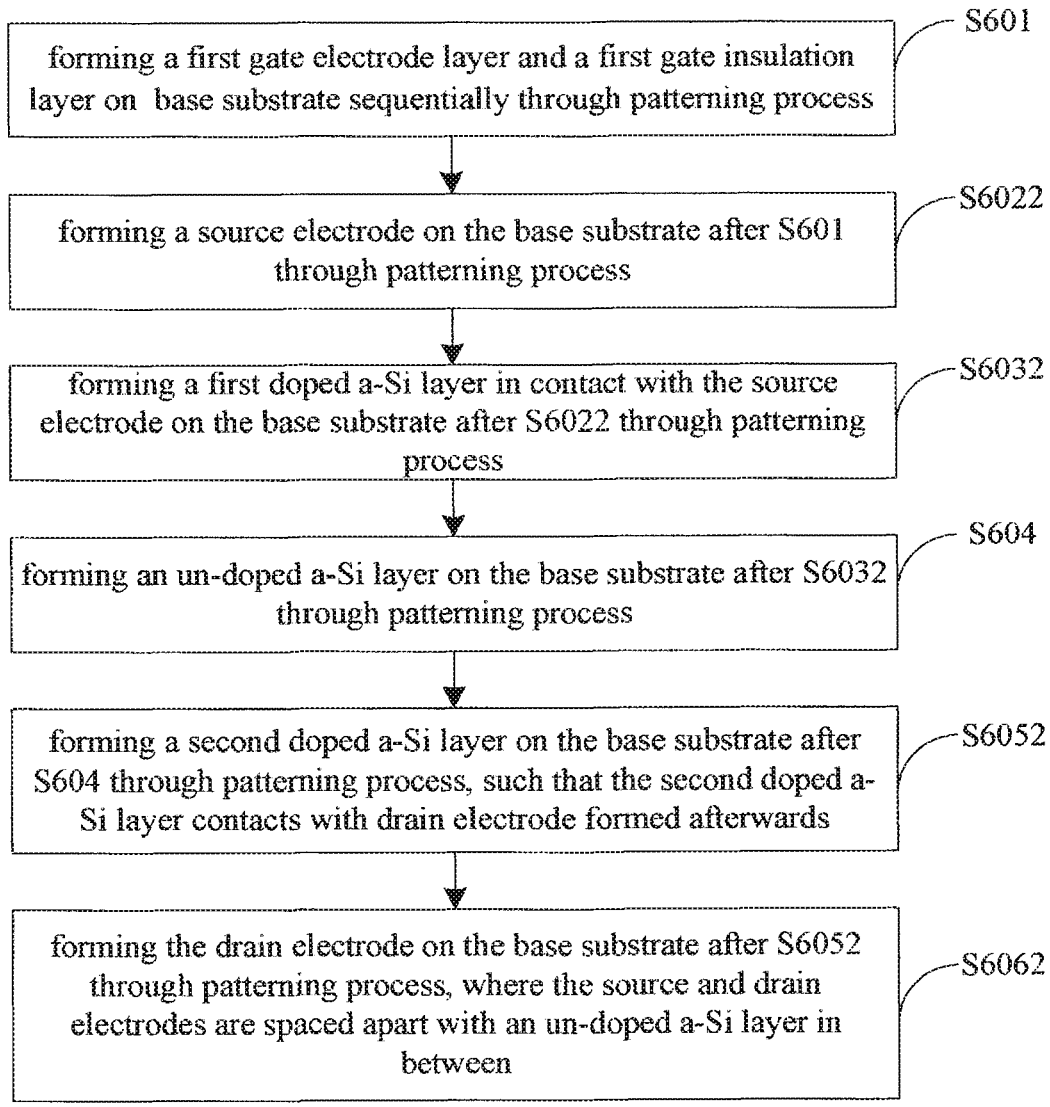

As an alternative, as shown in FIG. 6B, the method for fabricating the TFT according to embodiments of the present disclosure may include the following steps instead:

In step S601, a first gate layer and a first gate insulation layer are formed on a base substrate sequentially through a patterning process.

In step S6022, a source electrode is formed on the base substrate after step S601 through a patterning process.

In step S6032, a first doped a-Si layer connected with the source electrode is formed on the base substrate after step S6021 through a patterning process.

In step S604, an un-doped a-Si layer is formed on the base substrate after step S6032 through a patterning process.

In step S6052, a second doped a-Si layer is formed on the base substrate after step S604 through a patterning process, so as to achieve a contact between the second doped a-Si layer and a drain electrode formed afterwards.

In step S6062, the drain electrode is formed on the base substrate after step S6052 through a patterning process, where the source electrode and the drain electrode are spaced apart with the un-doped a-Si layer in between.

As shown in FIG. 3A, the first gate electrode layer 311 and the second gate electrode layer 321 are formed on the base substrate 10 according to specific embodiments of the present disclosure through a patterning process. In a specific embodiment of the present disclosure, the base substrate 10 is made of glass. However, in alternative embodiments, the base substrate 10 is made of ceramics or other suitable materials. The method for forming the first gate electrode layer 311 and the first gate insulation layer 321 on the base substrate 10 through a patterning process is the same as the conventional technology, which will not be repeated here again.

Next, the drain electrode 15 is formed on the above base substrate after the previous step through a patterning process. The drain electrode 15 according to a specific embodiment of the present disclosure is made of molybdenum (Mo) or other suitable metals, or of a composition metal that includes several kinds of metals. Here, the embodiments of the present disclosure impose no limitation on specific material of which the drain electrode is made. Specifically, a metal layer is deposited on the base substrate after the previous step. Then photoresist is coated on the metal layer. Next, the photoresist is exposed and developed so as to form photoresist coverage regions and photoresiste free regions, in which the photoresist coverage regions correspond to regions where the drain electrodes are to be formed. Thereafter, the exposed metal layer is etched and the remaining photoresist is removed after the etching process, thereby forming the drain electrode 15.

Next, the first doped a-Si layer 201 connected with the drain electrode 15 is formed on the base substrate after the previous step through a patterning process. Specifically, an un-doped a-Si film layer is deposited on the base substrate after the previous step. Then photoresist is coated on the un-doped a-Si film layer. Next, the photoresist is exposed and developed so as to form photoresist coverage regions and photoresiste free regions, in which the photoresist coverage regions correspond to regions where the first doped a-Si layer is to be formed. Thereafter, the exposed un-doped a-Si film layer is etched and the remaining photoresist is removed after the etching process. Next, a doping process is conducted on the formed un-doped a-Si film layer so as to form the first doped a-Si layer 201 from the un-doped a-Si film layer. According to specific embodiments of the present disclosure, when a doping process is conducted on the un-doped a-Si film layer, boron, phosphorus and other suitable elements may be doped thereinto. And the specific doping process is the same as the conventional technology, which will not be repeated here again.

Next, the un-doped a-Si layer 200 is formed on the base substrate after the previous step through a patterning process. In one embodiment of the present disclosure, a cross section of the un-doped a-Si layer 200 is of a step-like shape. It should be understood that in alternative embodiments, the cross section is of a "Z" shape or a reverse "Z" shape in a real fabricating process. Here, in this specific embodiment of the present disclosure, the cross section of the un-doped a-Si layer 200 is of a "Z" shape as an example, as shown in FIG. 3A. Specifically, an un-doped a-Si film layer is deposited on the base substrate after the previous step. Then photoresist is coated on the un-doped a-Si film layer. Next, the photoresist is exposed and developed so as to form photoresist coverage regions and photoresiste free regions, in which the photoresist coverage regions correspond to regions where the un-doped a-Si film layer is to be formed. Thereafter, the exposed un-doped a-Si film layer is etched and the remaining photoresist is removed after the etching process, thereby forming the un-doped a-Si layer 200.

Next, a second doped a-Si layer 202 is formed on the base substrate after the previous step through a patterning process, so as to achieve a contact between the second doped a-Si layer 202 and the source electrode formed afterwards. And a specific method for forming the second doped a-Si layer 202 is the same as that for the first doped a-Si layer 201, which will not be repeated here again.

Next, the source electrode 14, which is in contact with the second doped a-Si layer 202, is formed on the base substrate after the previous step through a patterning process. Here, the source electrode 14 and the drain electrode 15 are spaced apart with un-doped a-Si layer 200 in between. And a specific method for forming the source electrode 14 is the same as that for the drain electrode 15, which will not be repeated here again. In one embodiment of the present disclosure, the source electrode 14 is made of the same material as the drain electrode 15. A length value L in a ratio W/L of the TFT according to the embodiments of the present disclosure, which is also a distance between the source electrode 14 and the drain electrode 15, depends on a thickness of the un-doped a-Si layer 200. In comparison with the length value L of 4 μm in a ratio W/L of the TFT according to the conventional technology due to the exposure process, since the thickness of the un-doped a-Si layer 200 according to the embodiments of the present disclosure is smaller, the length value L can be reduced to only 1800 Å. Therefore, since the length value L can be reduced, the entire size of the TFT can be reduced too, thereby achieving a design with a higher aperture ratio and a super narrow bezel or even without bezel.

In one embodiment of the present disclosure, in order to better drive the TFT according to the embodiments of the present disclosure, after the source electrode 14 is formed, the method further includes forming a second gate insulation layer 322 on the base substrate having the source electrode 14 formed thereon through a patterning process. And a specific method for forming the second gate insulation layer 322 is the same as that for the first gate insulation layer 321, which will not be repeated here again. The only difference lies in that the method further includes forming a via-hole through the first gate insulation layer 321 and the second gate insulation layer 322 by the patterning process. This via-hole is used for forming an electrical connection between the first gate electrode 311 and a second gate electrode formed afterwards. Next, the second gate electrode 312 is formed on the base substrate having the second gate insulation layer 322 formed thereon through a patterning process. And a specific method for forming the second gate electrode 312 is the same as that for the first gate electrode 311, which will not be repeated here again.

As shown in FIG. 3B, a first gate electrode layer 311 and the first gate insulation layer 321 are formed on the base substrate 10 sequentially in a specific embodiment of the present disclosure. And a specific method for forming the first gate electrode layer 311 and the first gate insulation layer 321 is the same as that in the conventional technology, which will not be repeated here again.

Next, the source electrode 14 is formed on the base substrate after the previous step through a patterning process. And a specific method for forming the source electrode 14 is the same as that for forming the drain electrode 15 as shown in FIG. 3A, which will not be repeated here again.

Next, the first doped a-Si layer 201 connected with the source electrode 14 is formed on the base substrate after the previous step through a patterning process. And a specific method for forming the first doped a-Si layer 201 is the same as that for forming the first doped a-Si layer 201 as shown in FIG. 3A, which will not be repeated here again.

Next, the un-doped a-Si layer 200 is formed on the base substrate after the previous step through a patterning process. In one embodiment of the present disclosure, a cross section of the un-doped a-Si layer 200 is of a step-like shape, or alternatively of a "Z" shape or a reverse "Z" shape in a real fabricating process. Here, in this specific embodiment of the present disclosure, the cross section of the un-doped a-Si layer 200 is of a reverse "Z" shape as an example, as shown in FIG. 3B. And a specific method for forming the un-doped a-Si layer 200 is the same as that for forming the un-doped a-Si layer 200 as shown in FIG. 3A, which will not be repeated here again.

Next, the second doped a-Si layer 202 is formed on the base substrate after the previous step through a patterning process. And a specific method for forming the second doped a-Si layer 202 is the same as that for forming the second doped a-Si layer 202 as shown in FIG. 3A, which will not be repeated here again.

Next, the drain electrode 15, which is in contact with the second doped a-Si layer 202, is formed on the base substrate after the previous step through a patterning process. And a specific method for forming the drain electrode 15 is the same as that for forming the source electrode 14 as shown in FIG. 3A, which will not be repeated here again.

In one embodiment of the present disclosure, in order to better drive the TFT according to the embodiments of the present disclosure, after the drain electrode 15 is formed, the method further includes forming a second gate insulation layer 322 on the base substrate having the drain electrode 15 formed thereon through a patterning process. And a second gate electrode 312 is formed on the base substrate having the second gate insulation layer 322 formed thereon through a patterning process. Further the first gate electrode 311 and the second gate electrode 312 are electrically connected through a via-hole within the first gate insulation layer 321 and the second gate insulation layer 322.

Based on the above description, the embodiments of the present disclosure provide a TFT and a method for fabricating the same. The TFT includes a gate electrode, a gate insulation layer, a source electrode, a drain electrode and an active layer arranged on a base substrate. The active layer includes an un-doped a-Si layer, a first doped a-Si layer and a second doped a-Si layer. One of the source electrode and the drain electrode is in contact with the first doped a-Si layer, and the other of the source electrode and the drain electrode is in contact with the second doped a-Si layer. The source electrode and the drain electrode are on different horizontal planes and spaced apart from each other, and the un-doped a-Si layer is positioned between the source electrode and the drain electrode. Due to the fact that the source electrode and the drain electrode of the TFT according to the embodiments of the present disclosure are spaced apart from each other with the un-doped a-Si layer in between these two electrodes, a length value L in the W/L ratio of the TFT depends on a thickness of the un-doped a-Si layer instead. In comparison with the dependence of the length value L on the exposure process in the conventional technology, the length value L of the TFT can be further reduced, because the thickness of the un-doped a-Si layer is independent of the exposure process in the embodiments of the present disclosure, thereby reducing an entire size of the TFT accordingly.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A thin-film transistor (TFT) comprising a gate electrode, a gate insulation layer, a source electrode, a drain electrode and an active layer arranged on a base substrate,
   wherein the active layer comprises an un-doped a-Si layer, a first doped a-Si layer and a second doped a-Si layer,
   wherein one of the source electrode and the drain electrode is in contact with the first doped a-Si layer, wherein the other of the source electrode and the drain electrode is in contact with the second doped a-Si layer,
   wherein the source electrode and the drain electrode are on different horizontal planes and spaced apart from each other, and the un-doped a-Si layer is positioned between the source electrode and the drain electrode, wherein the source electrode is not overlapped with the drain electrode in a direction vertical to a surface of the base substrate, wherein a cross section of the un-doped a-Si layer comprises a step-like shape, wherein the step-like shape comprises a vertical part, a first horizontal part and a second horizontal part, wherein one of the first doped a-Si layer and the second doped a-Si layer is positioned below the first horizontal part, while the other of the first doped a-Si layer and the second doped a-Si layer is positioned above the second horizontal part, and wherein the vertical part is positioned between the source electrode and the drain electrode, the source electrode and the drain electrode are in direct contact with side surfaces of the vertical part.

2. The TFT according to claim 1, wherein:
the gate electrode comprises a first gate electrode and the gate insulation layer comprises a first gate insulation layer, and wherein:
the first gate electrode is arranged on the base substrate;
the first gate insulation layer is arranged on the first gate electrode;
the drain electrode is arranged on the first gate insulation layer;
the first doped a-Si layer is arranged on the drain electrode;
the first horizontal part of the un-doped a-Si layer is arranged on the first doped a-Si layer;
the second horizontal part of the un-doped a-Si layer is arranged on the first gate insulation layer;
the second doped a-Si layer is arranged on the second horizontal part; and
the source electrode is arranged on the second doped a-Si layer.

3. The TFT according to claim 2, further comprising:
a second gate insulation layer and a second gate electrode arranged sequentially on the source electrode,
wherein the first and second gate electrodes are connected electrically through a via-hole within the first and second gate insulation layers.

4. The TFT according to claim 3, further comprising a passivation layer arranged on the second gate electrode.

5. The TFT according to claim 4, further comprising a first electrode connected to the drain electrode and a second electrode arranged on the second gate insulation layer and the passivation layer.

6. The TFT according to claim 1, wherein the gate electrode comprises a first gate electrode and the gate insulation layer comprises a first gate insulation layer, and wherein:
the first gate electrode is arranged on the base substrate;
the first gate insulation layer is arranged on the first gate electrode;
the first horizontal part of the un-doped a-Si layer is arranged on the first gate insulation layer;
the first doped a-Si layer is arranged on the first horizontal part;
the drain electrode is arranged on the first doped a-Si layer;
the source electrode is arranged on the first gate insulation layer;
the second doped a-Si layer is arranged on a source layer; and
the second horizontal part of the un-doped a-Si layer is arranged on the second doped a-Si layer.

7. The TFT according to claim 6, further comprising:
a second gate insulation layer and a second gate electrode arranged sequentially on the drain electrode,
wherein the first and second gate electrodes are connected electrically through a via-hole within the first and second gate insulation layers.

8. The TFT according to claim 7, further comprising a passivation layer arranged on the second gate electrode.

9. The TFT according to claim 8, further comprising a first electrode connected with the drain electrode and a second electrode arranged on the second gate insulation layer and the passivation layer.

10. An array substrate comprising the TFT according to claim 1.

11. A display device comprising the array substrate according to claim 10.

12. A method for fabricating a thin-film transistor (TFT), the method comprising:
forming a gate electrode, a gate insulation layer, a source electrode, a drain electrode and an active layer on a base substrate,
wherein the active layer comprises an un-doped a-Si layer, a first doped a-Si layer and a second doped a-Si layer,
wherein one of the source electrode and the drain electrode is in contact with the first doped a-Si layer,
wherein the other of the source electrode and the drain electrode is in contact with the second doped a-Si layer,
wherein the source electrode and the drain electrode are on different horizontal planes and spaced apart from each other, and the un-doped a-Si layer is positioned between the source electrode and the drain electrode, wherein the source electrode is not overlapped with the drain electrode in a direction vertical to a surface of the base substrate, and
wherein a cross section of the un-doped a-Si layer comprises a step-like shape, wherein the step-like shape comprises a vertical part, a first horizontal part and a second horizontal part;
positioning one of the first doped a-Si layer and the second doped a-Si layer below the first horizontal part, and positioning the other of the first doped a-Si layer and the second doped a-Si layer above the second horizontal part; and
positioning the vertical part between the source electrode and the drain electrode, wherein the source electrode and the drain electrode are in direct contact with side surfaces of the vertical part.

13. The method according to claim 12, further comprising:
forming a first gate electrode and a first gate insulation layer on the base substrate sequentially;
forming one of the source electrode and the drain electrode on the first gate insulation layer;
forming one of the first and second doped a-Si layers in contact with the one of the source electrode and the drain electrode on the one of the source electrode and the drain electrode;
forming the un-doped a-Si layer on the first gate insulation layer and the one of the first and second doped a-Si layers;
forming the other of the first and second doped a-Si layers on the first gate insulation layer; and forming the other of the source electrode and the drain electrode on the other of the first and second doped a-Si layers, wherein the other of the source electrode and the drain electrode is in contact with the other of the first and second doped a-Si layers.

14. The method according to claim 13, wherein subsequent to the step of forming the other of the source electrode and the drain electrode, the method further comprises:

forming a second gate insulation layer on the base substrate on which the other of the source electrode and the drain electrode is arranged; and forming a second gate electrode on the base substrate on which the second gate insulation layer is arranged, wherein the first and second gate electrodes are connected electrically through a via-hole within the first and second gate insulation layers.

15. The method according to claim 14, further comprising forming a passivation layer on the second gate electrode.

16. The method according to claim 15, further comprising:

forming a first electrode on the second gate insulation layer and the passivation layer; and forming a second electrode which is connected to the drain electrode.

17. A method for fabricating an array substrate, comprising the method for forming the TFT according to claim 12.

18. A method for forming a display device comprising the method for fabricating an array substrate according to claim 17.

* * * * *